United States Patent
Vigier-Blanc

(10) Patent No.: US 7,391,576 B2
(45) Date of Patent: Jun. 24, 2008

(54) MANUFACTURING OF OPTICAL UNITS FOR SEMICONDUCTOR PACKAGES WITH OPTICAL SENSORS

(75) Inventor: Emmanuelle Vigier-Blanc, Le Sappey en Chartreuse (FR)

(73) Assignee: STMicroelectronics S.A., Montrouge (FR)

( * ) Notice: Subject to any disclaimer, the term of this patent is extended or adjusted under 35 U.S.C. 154(b) by 60 days.

(21) Appl. No.: 11/187,691

(22) Filed: Jul. 22, 2005

(65) Prior Publication Data

US 2006/0018029 A1 Jan. 26, 2006

(30) Foreign Application Priority Data

Jul. 23, 2004 (FR) .................................. 04 51640

(51) Int. Cl.
*G02B 3/00* (2006.01)
*G02B 27/10* (2006.01)
*H01L 21/00* (2006.01)

(52) U.S. Cl. ........................... 359/642; 359/619; 438/65

(58) Field of Classification Search ................. 359/642, 359/619, 622; 257/666, 432, 433; 438/65
See application file for complete search history.

(56) References Cited

U.S. PATENT DOCUMENTS 5,617,131 A 4/1997 Murano et al.
7,091,469 B2 * 8/2006 Kossives et al. .......... 250/214.1
2002/0034022 A1 3/2002 Nakamura
2004/0218876 A1 11/2004 Franiatte
2005/0161805 A1 * 7/2005 Ono et al. .................... 257/704
2007/0085180 A1 * 4/2007 Kim et al. .................... 257/678

FOREIGN PATENT DOCUMENTS

FR 2 835 654 A1 8/2003

OTHER PUBLICATIONS

French Search Report from French Patent Application No. 04/51640, filed Jul. 23, 2004.
Patent Abstracts of Japan, vol. 011, No. 195 (E_518), Jun. 23, 1987 & JP 62 021282 A (Nippon Telegr $ Teleph Corp.), Jan. 29, 1987.
Patent Abstracts of Japan, vol. 1999, No. 08, Jun. 30, 1999 & JP 11 068126 A (Nikon Corp.), Mar. 9, 1999.
Patent Abstracts of Japan, vol. 1995, No. 08, Sep. 29, 1995 & JP 07 132644 A (Kyocera Corp.), May 23, 1995.

* cited by examiner

*Primary Examiner*—Mohammed Hasan
(74) *Attorney, Agent, or Firm*—Lisa K. Jorgenson; James H. Morris; Wolf, Greenfield & Sacks, P.C.

(57) ABSTRACT

An optical unit including a glass substrate supporting a diaphragm intended to receive a lens with a circular base, the surface of the diaphragm having one or several protruding elements for guiding the lens in horizontal positioning, and its manufacturing method.

14 Claims, 2 Drawing Sheets

MANUFACTURING OF OPTICAL UNITS FOR SEMICONDUCTOR PACKAGES WITH OPTICAL SENSORS

BACKGROUND OF THE INVENTION

1. Field of the Invention

The present invention relates to the field of optical sensors associated with semiconductor devices and, more specifically, to the manufacturing of a semiconductor package with an optical sensor and especially of the optical unit thereof.

Such semiconductor packages with an optical sensor are used, for example, to form miniature cameras or shooting devices, for example in portable phones.

2. Discussion of the Related Art

Optical units for devices with an optical sensor of semiconductor packages are essentially formed of a hemispherical lens arranged on a diaphragm placed at a focal distance from a microlens array formed on an integrated circuit chip forming the optical sensor.

A first known family of optical units is formed of a rotatable plastic cap intended to hang up the lens and the diaphragm, and to be arranged on the integrated circuit chip. The cap rotation is especially used to adjust the focal distance, and thus as a focusing device. This optical unit family is generally intended for lenses made of plastic material having positioning and manufacturing tolerances (on the order of more or less 80 micrometers) incompatible with the small focal distance (a few millimeters) of this type of device.

A second known family of optical units consists of using a glass lens (generally hemispherical) arranged on a diaphragm formed on a glass spacer, itself resting on the integrated circuit chip supporting the microsensors (phototransistors, microdiaphragms, and microlenses). The present invention more specifically applies to this family of optical units.

FIG. 1 shows a conventional example of a semiconductor package with an optical sensor such as described in French patent application 03/12305 (03/GR2/190) which is incorporated herein by reference.

Such a package 10 forming a shooting element comprises an integrated circuit chip 1 forming an optical sensor, on which hemispherical microlenses 2 have been shown. In practice, these microlenses are integrated in the silicon of chip 1 above the phototransistors.

Package 10 also comprises a lens 3 arranged at a distance from chip 1 and a diaphragm 4 against the lower surface (opposite to the sensor) of lens 3. A glass spacer 6, relatively thick (on the order of a few millimeters) with respect to the thickness of chip 1, is interposed between chip 1 and diaphragm 4 and defines the focal distance of the optical device. The above-described assembly is formed by batches in whole plates before being cut for individualization. The assembly then rests on a substrate 5. The electric information provided by integrated circuit chip 1 is transferred, for example, from the upper surface of this chip supporting microlenses 2 by means of wires 52 of contact transfer to pads 53 at the upper substrate surface, pads 53 being electrically connected to pads 54 at the rear (free) surface of substrate 5 via vias 51 across its thickness. Pads 54 then generally receive conductive balls or bosses 55 for assembly of the semiconductor package on a printed circuit, as a BGA (ball grid array) package.

In practice, spacer 6 is obtained by means of a glass plate against the respective surfaces of which are arranged on the one hand a diaphragm grid 4 and a lens plate 3 and, on the other hand, integrated circuit chips 1 supported by substrates 5, a spacer 7 of relatively small thickness with respect to the thickness of spacer 6 being provided to avoid for chip 1 to touch spacer 6 and to be damaged on assembly.

In the example of FIG. 1, it is assumed that optics 3 are formed of a hemispherical glass lens. As an alternative, the definitive curvature of the focusing lens may be adapted by plunging the hemispherical lens into a cavity containing an optical resin which polymerizes by a replication method, to add a surface layer (not shown) giving it the desired curvature.

Once the devices, formed of chip 1 supported by substrate 5, of spacer 6, and of optics 4, have been individualized, a casing 8 generally made of plastic matter (resin) is arranged around the assembly to protect the system and to complete package 10.

FIGS. 2A to 2D illustrate the conventional assembly of hemispherical lens 3 on diaphragm 4, supported by glass spacer 6. This assembly is generally performed after cutting of integrated circuits 1 and of spacers 6 supporting diaphragms 4.

A first step (FIG. 2A) consists of depositing a drop g of glue on diaphragm 4 supported by spacer 6.

The glue spreads on the diaphragm (FIG. 2B) and fills opening 41 thereof. A layer g' of glue is obtained on the structure.

A hemispherical glass lens 3 is then added (FIG. 2C) on glue layer g' and the assembly is submitted to an ultraviolet processing to have the glue polymerize. The glue is selected to be thixotropic, that is, with no capillary effect, to avoid its upward migration on the lens, which would modify its optical properties.

Finally (FIG. 2D), integrated circuit 1 is arranged on the rear surface of glass spacer 6, conductive bosses 54 are formed at the rear surface and the entire unit is topped with plastic matter to form casing 8.

A problem of the assembly thus formed is that, when lens 3' is laid on non-solidified glue layer g', it floats thereon, which considerably increases horizontal positioning tolerances. This phenomenon is particularly notable when the lenses are desired to be assembled on whole wafers. A disadvantage is that this generates resolution problems.

In certain cases, diaphragms 4 are formed of a metal grid arranged on the glass wafer forming spacers 6. In such a case, an additional problem of horizontal shift of the metal gates with respect to the centers of the lenses appears. Further, the etch tolerances of openings 41 in these grids are greater (on the order of more or less 5 micrometers) with respect to the tolerances in the lens diameter (more or less 3 micrometers for a diameter on the order of 3 millimeters).

The lens floating on the glue mat however remains the most critical since it adds a much greater tolerance, on the order of more or less 100 micrometers.

SUMMARY OF THE INVENTION

The present invention aims at overcoming the disadvantages of conventional assemblies of hemispherical lenses on diaphragms of miniaturized optical units.

The present invention especially aims at providing an assembly method which optimizes the centering of the lenses with respect to the centers of the diaphragm openings and to the sensor centers.

The present invention also aims at providing a solution which improves the number of steps that can be performed by batches on whole wafers.

To achieve these and other objects, the present invention provides a method for manufacturing an optical unit of a semiconductor package with an optical sensor, comprising:

depositing, on a front surface of a glass wafer having a thickness selected to form a spacer between the optical sensor and a focusing lens with a circular base, an opaque metal layer;

etching this layer according to a pattern for defining openings of diaphragms between the lens and the spacer, and one or several guiding elements at the periphery of a circle in which the base of the lens to be placed on the diaphragm inscribes; and cutting the wafer to individualize optical units on which are placed said lenses positioned due to said guiding elements.

According to an embodiment of the present invention, a front surface of a wafer containing the optical sensors is placed, before cutting, on a rear surface of the glass wafer.

According to an embodiment of the present invention, electric connection conductive bosses are formed, before cutting, at the rear surface of the wafer supporting the optical sensors.

According to an embodiment of the present invention, a definitive hold casing is placed around the unit.

According to an embodiment of the present invention, the temporary hold of the lens on the diaphragm is performed by molecular bonding.

The present invention also provides an optical unit comprising a glass substrate supporting a diaphragm intended to receive a lens with a circular base, the surface of the diaphragm comprising one or several protruding elements for guiding the lens in a horizontal positioning.

According to an embodiment of the present invention, at least three punctual elements are distributed at the periphery of a circle in which the circular base of the lens inscribes.

The foregoing objects, features, and advantages of the present invention will be discussed in detail in the following non-limiting description of specific embodiments in connection with the accompanying drawings.

DETAILED DESCRIPTION

Figure 1:
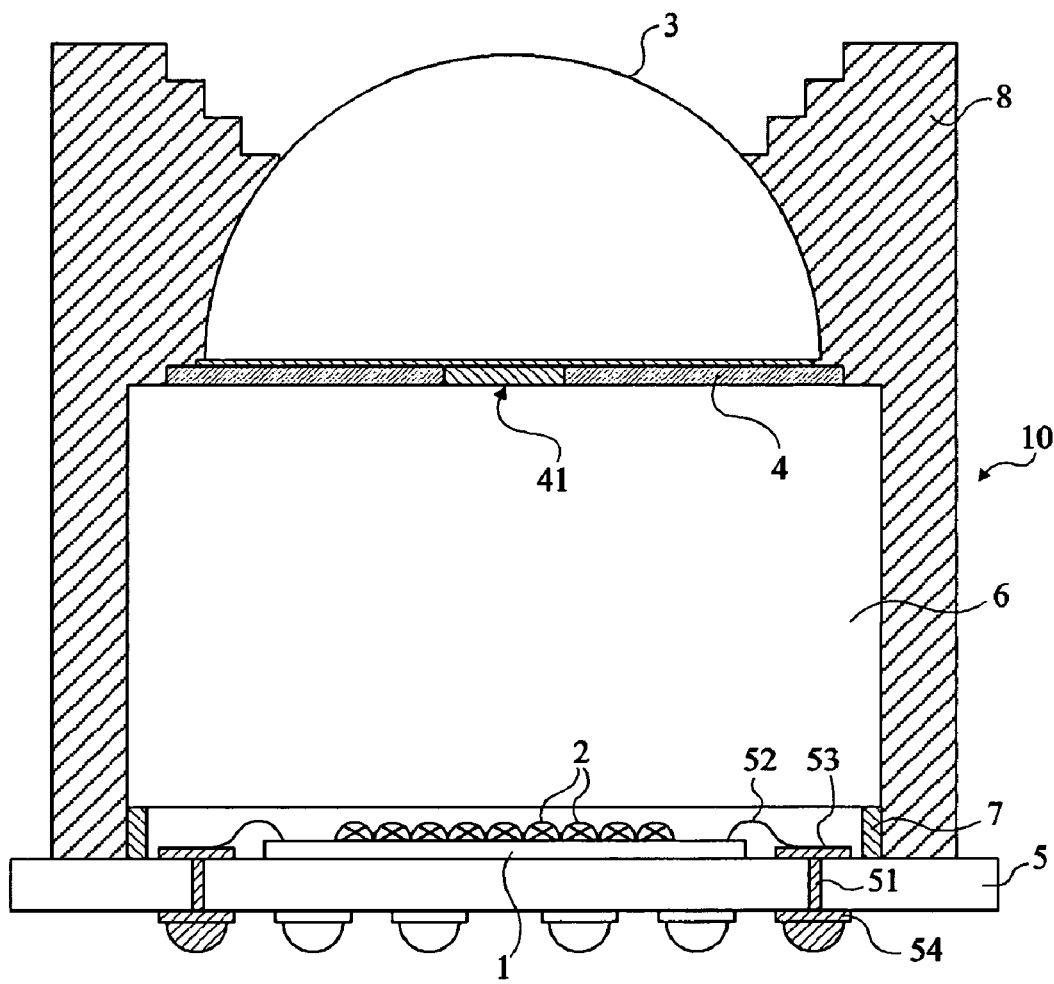
FIGS. 1, 2A, 2B, 2C, and 2D, previously described, are intended to show the state of the art and the problem to solve.
Figures 2A, 2B, 2C, 2D:
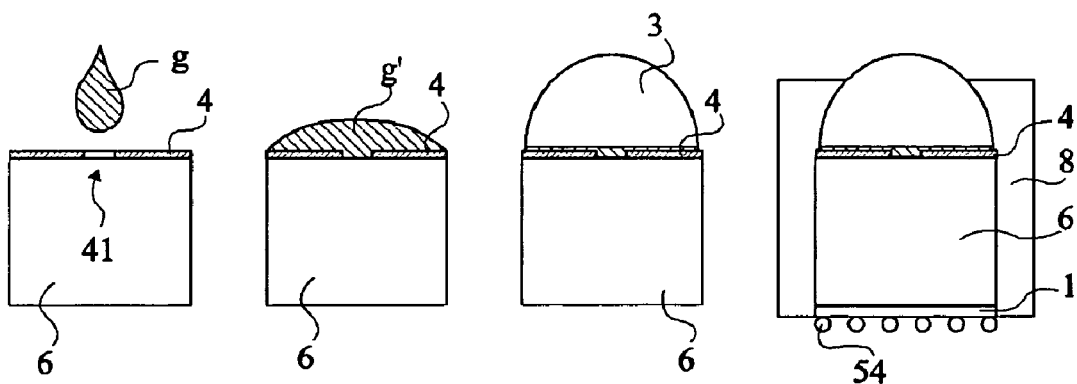

For clarity, the same elements have been referred to with the same reference numerals in the different drawings. Further, as usual in the representation of integrated circuits, the various drawings are not to scale. Further, only those elements and steps that are necessary to the understanding of the present invention have been shown in the drawings and will be described hereafter. In particular, the manufacturing of the integrated circuit chip forming the actual microlens sensor has not been described in detail, the present invention being compatible with any conventional sensor. Further, those steps which are derived from methods currently used in semiconductor manufacturing technology have not been described in detail because they are readily accessible to those skilled in the art.

A feature of the present invention is to provide, in the layer forming the diaphragm or in a layer arranged thereon, a guide for positioning the hemispherical lenses.

Preferably, the lenses deposited on the diaphragms are temporarily maintained by molecular bonding before they are definitively maintained by the casing of the unit.

Figure 3A:
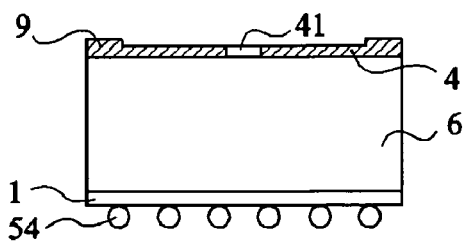
FIGS. 3A, 3B, and 3C very schematically illustrate in cross-section views an embodiment of the assembly method according to the present invention, on an individual optical unit.
Figure 3B:
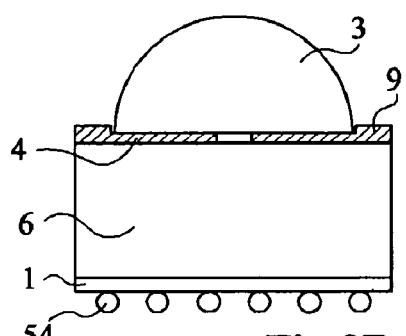
Figure 3C:
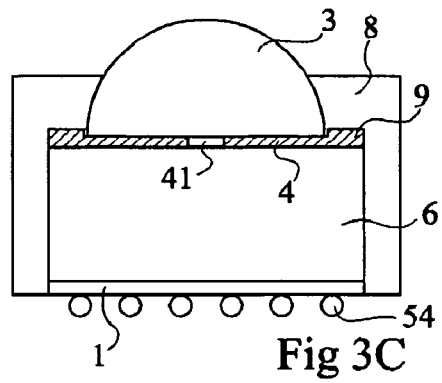

FIGS. 3A, 3B, and 3C very schematically illustrate the structure of an individual unit according to the present invention during assembly thereof.

The assembly of a hemispherical lens 3 (FIG. 3B) on a diaphragm 4 supported by a glass spacer 6 according to the present invention is performed on a structure such as shown in FIG. 3A in which one or several elements 9 for horizontally guiding the lens protrude with respect to the surface of diaphragm 4.

Once the lenses have been positioned, a casing 8 is conventionally arranged and the semiconductor package with an optical sensor is obtained.

It could have been devised to improve the lens positioning by temporarily placing them in a positioning grid. This solution may be problematic since this would, on the one hand, pose a problem of temporary grid hold and, on the other hand, generate a risk of scratching or of separating the hemispheres forming the lenses when this grid would be removed.

Figure 4:
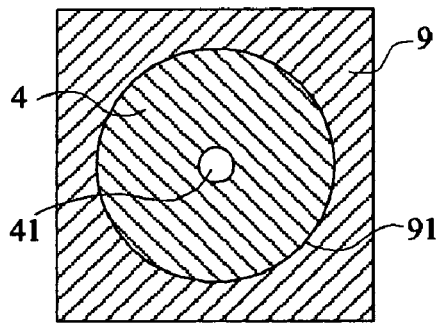
FIGS. 4 and 5 are top views of embodiments of diaphragms provided with positioning elements according to the present invention.

FIG. 4 illustrates in a top view of a diaphragm 4 a first embodiment of guiding means according to the present invention. It is a continuous change of circular section (circle 91) with an inner diameter slightly greater than the diameter of the hemispherical surface of lens 3. "Slightly greater" means a diameter enabling engagement of this lens without allowing the lens play to be greater than the desired positioning tolerances (a few micrometers). This play should be compatible with manufacturing tolerances of the glass hemispherical lens (for example, more or less three micrometers for a lens with a three-millimeter diameter). Guiding element 9 is thus formed of the periphery of circle 91 in which the lens inscribes. To illustrate the plane change in diaphragm 4, different hatchings have been used for the two different planes around opening 41.

The height of protruding element 9 with respect to the diaphragm plane ranges, for example, between 50 and 100 micrometers.

Figure 5:
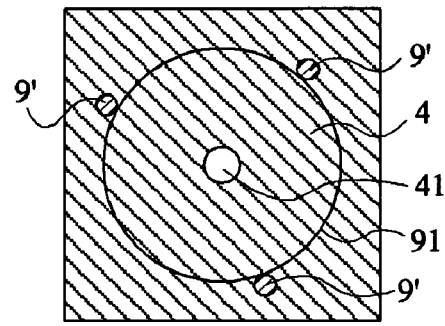

FIG. 5 illustrates, in a top view of a diaphragm 4', a second preferred embodiment of guiding means according to the present invention. It is formed of local pads 9' protruding from the surface of diaphragm 4. The number of pads 9' is at minimum 3. These pads are positioned around an imaginary circle 91 within which a lens 3 must be positioned.

According to a preferred embodiment, the hold of lens 3 on the surface of diaphragm 4 is temporarily ensured by molecular bonding. This molecular bonding is made possible by the fact that the surface of lens 3 is polished for optical reasons and the upper surface of diaphragm 4 exhibits a surface state of optical type, obtained by chemical etch, by using usual semiconductor manufacturing techniques.

The present invention then takes advantage from the fact that, to preserve the optical operation of the device, the opposite surfaces of the diaphragm and of the lens need be as planar as possible, to obtain a blind flange. Such a planeness precisely enables obtaining a molecular bonding.

For the seal to be full under the entire lens surface, the metal layer of the diaphragm will be preferentially directly formed on the glass wafer, in which islands intended to subsequently form openings 41 in the opaque layer will have been previously formed.

The obtained molecular bonding is sufficient to enable handling of the units until their positioning in a mold of formation of casing 8 which ensures the definitive fixation.

In the embodiment of FIG. 5, a small amount of glue may be used instead of the molecular bonding. It will however be preferred to avoid a temporary gluing step in the manufacturing process.

In the embodiment of FIG. 4, the use of glue will be avoided, since said glue would risk to migrate upwards by capillary effect along the entire lens surface.

Figure 6A:
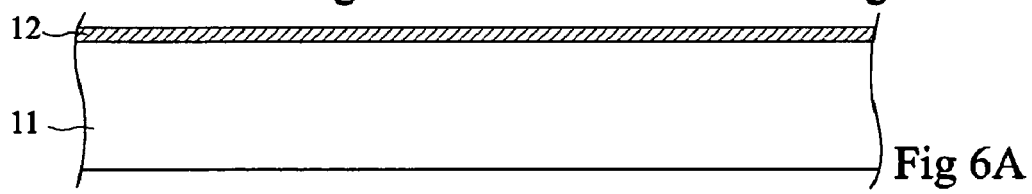
FIGS. 6A, 6B, and 6C illustrate characteristic steps of the method for manufacturing semiconductor packages with an optical sensor according to the present invention.
Figure 6B:
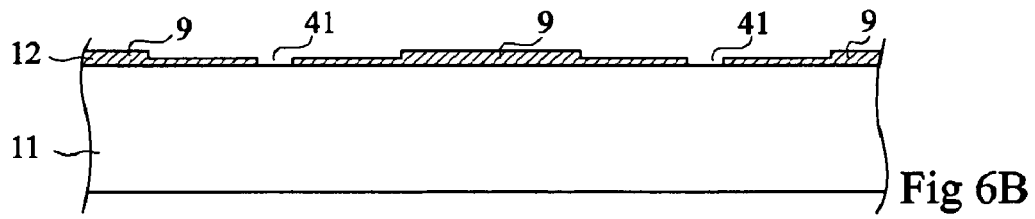
Figure 6C:
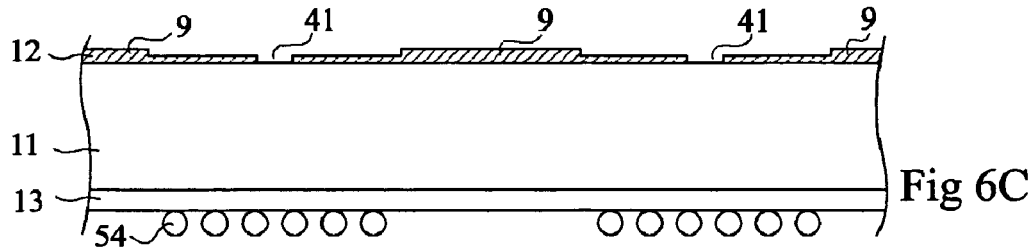

FIGS. 6A, 6B, and 6C illustrate in very simplified fashion an embodiment of the optical sensor semiconductor package manufacturing method according to the present invention.

It is started (FIG. 6A) from a glass plate 11 on which a metal layer 12 is deposited full plate (in one or several steps). The thickness of layer 12 is selected to be greater than the final desired thickness for guiding or pre-positioning elements 9 (or 9').

Layer 12 is then etched according to patterns of definition of openings 41 of the diaphragms and of guiding elements 9 or 9' (FIG. 6B). This etching uses usual photographic etch techniques (by means of a deposition of photosensitive layers). Several successive etch steps may be necessary according to the used techniques.

The plate thus formed is placed (FIG. 6C) on an integrated circuit wafer 13 containing the actual sensors. This plate is conventionally formed and in particular comprises the phototransistor network. Conductive bosses 54 of the finished package have also been shown in FIG. 6C. Indeed, the present invention is compatible with the forming by whole wafers of these bosses 54. At the end of the steps shown in FIG. 6C, the optical units are individualized by conventional cutting means, for example, by sawing, by water, or by laser. This then provides the structures shown in FIG. 3A on which are then arranged the hemispherical lenses (FIG. 3B), and which are molded in a casing 8 (FIG. 3C).

In the case where the temporary hold of lens 3 is performed by molecular bonding, it may be necessary to perform an additional etch step at the beginning of the method to provide for openings 41 of diaphragms 4 to be formed by glass or resin pads or islands and thus ensure the full junction between the lens and the diaphragm.

According to another embodiment, a small amount of thixotropic glue is used to hold the lens and fill the space of the diaphragm opening. As indicated previously, this embodiment is however preferentially dedicated to the case where the temporary hold elements are punctual to avoid trapping the glue, which would cause an upward migration thereof on the edges of lens 3.

An advantage of the present invention is that it solves the problems of horizontal hemispherical lens positioning on optical units of small dimension.

Another advantage of the present invention is that it optimizes the number of manufacturing steps that may be performed by whole wafers. In particular, and although this is not compulsory, the processing by whole wafers may go as far as the forming of conductive bosses at the rear surface.

Another advantage of the present invention is that it is compatible with the other conventional optical sensor semiconductor device manufacturing steps and especially with the forming of the actual phototransistor sensor.

Of course, the present invention is likely to have various alterations, modifications, and improvements which will readily occur to those skilled in the art. In particular, the dimensions to be given to temporary hold 9 and 9' and the play of circle 91 around which they inscribe for the lens positioning are within the abilities of those skilled in the art according to the actual lens manufacturing tolerances. Further, although the present invention has been described in relation with hemispherical lenses, it applies to lenses of different curvature, provided that they have a circular base.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing one or more optical units of a semiconductor package, comprising:
   depositing an opaque metal layer on a front surface of a glass wafer, the glass wafer having a thickness selected to form a spacer between an optical sensor and a focusing lens with a circular base; and
   etching said layer according to a pattern for defining an opening of a diaphragm between the lens and the spacer, and for defining one or more guiding elements at the periphery of a circle within which the base of the lens is to be placed and
   cutting the wafer to individualize optical units on which is to be placed the lens to be positioned with the guiding elements.

2. The method of claim 1, further comprising placing a front surface of a wafer containing optical sensors on a rear surface of the glass wafer before cutting the wafer.

3. The method of claim 2, further comprising forming electric connection conductive bosses at the rear surface of the wafer containing the optical sensors before cutting the wafer.

4. The method of claim 1, further comprising temporarily holding the lens on the diaphragm with molecular adhesion.

5. The method of claim 1, further comprising:
   etching said layer according to a pattern for defining an opening of each diaphragm of a plurality of diaphragms disposed between each of a plurality of lenses and spacers;
   etching said layer according to a pattern for defining one or more guiding elements at each of a plurality of peripheries of circles within each of which a lens base is to be placed;
   positioning the lenses on the diaphragms with each of said one or more guiding elements; and
   cutting the wafer to individualize each optical unit of the one or more optical units.

6. The method of claim 1, wherein etching said layer according to a pattern for defining one or more guiding elements comprises etching said layer according to a pattern for defining a circular area having a lower plane than the area outside of the circular area.

7. The method of claim 1, wherein etching said layer according to a pattern for defining one or more guiding elements comprises etching said layer according to a pattern for defining three or more protruding pads.

8. The method of claim 1, further comprising attaching a focusing lens to the diaphragm.

9. The method of claim 8, further comprising placing a definitive hold casing around the unit.

10. An optical unit comprising:
    a glass substrate;
    a diaphragm disposed on the glass substrate;
    a lens having a base;
    means for horizontally positioning the lens base on the diaphragm;

wherein the means for positioning the base extends between 50 and 100 micrometers from a plane of the diaphragm where the lens base is positioned.

11. The optical unit of claim 10, further comprising a plurality of optical sensors placed on the glass substrate.

12. The optical unit of claim 11, further comprising thixotropic glue in an opening in the diaphragm.

13. The optical unit of claim 10, wherein the lens is hemispheric.

14. The optical unit of claim 10, further comprising a casing placed around the optical unit.

* * * * *